(12) United States Patent
Ostholt et al.

(10) Patent No.: US 12,398,066 B2
(45) Date of Patent: Aug. 26, 2025

(54) METHOD FOR PRODUCING A DISPLAY HAVING A CARRIER SUBSTRATE, A CARRIER SUBSTRATE PRODUCED ACCORDING TO SAID METHOD, AND A COVER GLASS INTENDED FOR A FLEXIBLE DISPLAY

(71) Applicant: LPKF Laser & Electronics AG, Garbsen (DE)

(72) Inventors: Roman Ostholt, Langenhagen (DE); Daniel Dunker, Hannover (DE); Sergej Schneider, Hannover (DE)

(73) Assignee: LPKF LASER & ELECTRONICS AG, Garbsen (DE)

( * ) Notice: Subject to any disclaimer, the term of this patent is extended or adjusted under 35 U.S.C. 154(b) by 889 days.

(21) Appl. No.: 17/610,733

(22) PCT Filed: Apr. 27, 2020

(86) PCT No.: PCT/DE2020/100341
§ 371 (c)(1),
(2) Date: Nov. 12, 2021

(87) PCT Pub. No.: WO2020/228893
PCT Pub. Date: Nov. 19, 2020

(65) Prior Publication Data
US 2022/0223806 A1 Jul. 14, 2022

(30) Foreign Application Priority Data

May 13, 2019 (DE) ...................... 10 2019 112 472.7
May 20, 2019 (DE) ...................... 10 2019 113 344.0
(Continued)

(51) Int. Cl.
C03C 15/00 (2006.01)
C03C 23/00 (2006.01)
(Continued)

(52) U.S. Cl.
CPC .......... *C03C 15/00* (2013.01); *C03C 23/0025* (2013.01); *H10K 50/84* (2023.02);
(Continued)

(58) Field of Classification Search
CPC .... G06K 19/07773; H01Q 1/38; H01Q 1/521; H01Q 1/2225; C03C 15/00;
(Continued)

(56) References Cited

U.S. PATENT DOCUMENTS

2016/0057834 A1* 2/2016 Lin .................. H05B 33/10
313/511
2016/0059359 A1 3/2016 Krueger et al.
(Continued)

FOREIGN PATENT DOCUMENTS

DE 102016125938 A 7/2018
EP 3301506 A1 4/2018
(Continued)

*Primary Examiner* — Patricia D Valenzuela
(74) *Attorney, Agent, or Firm* — LEYDIG, VOIT & MAYER, LTD.

(57) ABSTRACT

A method for producing a display comprising a carrier substrate made of glass, the display having flexible, bendable and/or elastic properties in a predetermined region of the carrier substrate, includes introducing modifications into the carrier substrate within the region by laser radiation along a closed and/or linear contour and/or points. Within the region, a one flexible, bendable and/or elastic layer is applied. A side of the carrier substrate facing away from the layer is subjected to an etching attack, by which material removal from the carrier substrate takes place along the modifications along the contour and/or at the points of the region until recesses are produced that extend across or over a substantial part of a material thickness of the carrier substrate.

15 Claims, 9 Drawing Sheets

(30) Foreign Application Priority Data

Jul. 4, 2019 (DE) .................. 10 2019 118 158.5
Oct. 30, 2019 (DE) .................. 10 2019 129 359.6

(51) Int. Cl.
*H10K 50/84* (2023.01)
*H10K 71/00* (2023.01)
*H10K 77/10* (2023.01)
H10K 59/10 (2023.01)
H10K 59/80 (2023.01)
H10K 71/40 (2023.01)
H10K 102/00 (2023.01)

(52) U.S. Cl.
CPC ........... *H10K 71/00* (2023.02); *H10K 77/111* (2023.02); *H10K 59/10* (2023.02); *H10K 59/87* (2023.02); *H10K 71/40* (2023.02); *H10K 2102/311* (2023.02)

(58) Field of Classification Search
CPC .... C03C 23/0025; C03C 17/34; H10K 50/84; H10K 71/00; H10K 77/111; H10K 59/10; H10K 59/87; H10K 71/40; H10K 2102/311; H10K 71/851; Y02E 10/549
See application file for complete search history.

(56) References Cited

U.S. PATENT DOCUMENTS

2017/0294495 A1* 10/2017 Shyu .................. H10K 50/8423
2018/0150108 A1   5/2018 Song

FOREIGN PATENT DOCUMENTS

| EP | 2709091 | B1 | 2/2019 |
| EP | 3206108 | B1 | 3/2019 |
| EP | 3456036 | A1 | 3/2019 |
| JP | 2007069216 | A | 3/2007 |
| JP | 2013009016 | A | 1/2013 |
| WO | WO 2014161534 | A2 | 10/2014 |
| WO | WO 2018008865 | A1 | 1/2018 |

* cited by examiner

METHOD FOR PRODUCING A DISPLAY HAVING A CARRIER SUBSTRATE, A CARRIER SUBSTRATE PRODUCED ACCORDING TO SAID METHOD, AND A COVER GLASS INTENDED FOR A FLEXIBLE DISPLAY

CROSS-REFERENCE TO PRIOR APPLICATIONS

This application is a U.S. National Phase application under 35 U.S.C. § 371 of International Application No. PCT/DE2020/100341, filed on Apr. 27, 2020, and claims benefit to German Patent Application Nos. DE 10 2019 112 472.7 filed on May 13, 2019, DE 10 2019 113 344.0 filed on May 20, 2019, DE 10 2019 118 158.5 filed on Jul. 4, 2019, and DE 10 2019 129 359.6 filed on Oct. 30, 2019. The International Application was published in German on Nov. 19, 2020 as WO 2020/228893 A1 under PCT Article 21(2).

FIELD

The invention relates to a method for producing a display having a carrier substrate, especially, a glass substrate, with flexible, bendable and/or elastic properties at least in a predetermined region of the carrier substrate.

Such displays, for example on the basis of organic light-emitting diodes (OLED), are becoming increasingly important for display purposes, in particular in the case of small devices, such as mobile portable devices, including value-related and security documents, since they can be produced as very thin layers.

BACKGROUND

How to produce flexible OLED displays is known. For this purpose, methods for subsequently structuring a flexible organic light-emitting diode (FOLED), with which one or more layers are removed step by step from the stacked layer arrangement by means of laser radiation (ablation), are already known.

Since these can be made of layers of organic materials on flexible carrier substrates, including flexible driver circuits, they can be adapted to non-planar surfaces or used in structures that themselves have flexible properties.

The sensitivity of OLED materials to oxygen and/or humidity has proven to be problematic, which results in relatively short service lives. This can be solved, for example, by installing the actual OLED components between two glass layers, which are essentially free of oxygen and/or vapor diffusion.

Another possibility is to use the OLED display on a glass substrate with a barrier layer. These barrier layers can be made, for example, of silicon oxides (SiO2), (boro-) silicates, aluminates (Al2O3) or metal layers (Al, Ag, Au, Rh) or other corresponding materials.

Such OLED structures or devices will remain flexible if the glass layers have a thickness below certain limits. Typically, OLEDs with glass layers and a thickness of 100 µm or less still have the necessary flexibility for most purposes.

However, such thin glass layers, i.e., below 50 µm, or even below 20 µm, are fragile and have a tendency to break on account of their brittleness. It is thus desirable from this aspect to connect such OLEDs to mechanically strong (flexible or non-flexible) carrier substrates in order to make them sturdier.

In the production of classical displays for smart phones, a carrier substrate made of glass is used as the lowest layer, the so-called "backplane". The properties of engineering glasses are ideal for the requirements of a backplane.

The development of foldable displays for new types of smartphones was accompanied by a significant change in the process sequence. In the current approach, backplanes made of glass which were originally intended for stabilizing and fastening the electronic components must be removed after installation of the components in a complex method that increases rejects (laser lift-off method). In this way, only the flexible components of the display are left without the protective backplanes.

The laser lift-off method involves the transfer of a microelectronic functional layer onto a new carrier substrate, which is lighter and thinner. The layers are usually separated by selective laser ablation and vapor-deposition of a highly absorbent intermediate layer, typically a polymer layer. It is crucial that the adjacent microelectronic functional layer is not harmed by the energy of the laser radiation.

The production of flexible displays, whether used in a smartphone, tablet or e-reader, always have one thing in common: The circuitry layers for individual pixel control no longer lie on a solid glass carrier but on a flexible layer.

Disadvantages of the conventional laser lift-off method are the high process times/production costs and the rejects additionally created by the method, since with this method displays can be damaged.

Such flexible display devices are known, for example, from EP 3206108 B1, EP 3456036 A1 or EP 2709091 B1.

Furthermore, US 2016/0 057 834 A1 relates to a method for producing a substrate for a display module. A substrate body with a signal circuit region is applied to a transparent carrier plate. A plurality of openings are made in the substrate body and a lower surface is etched through the transparent carrier plate by high-energy light, in order to separate the substrate body from the transparent carrier plate.

JP 2013-009016 A relates to a plurality of thin-film elements on a semiconductor layer, with which an etching groove is introduced between a plurality of thin-film elements by laser etching.

SUMMARY

In an embodiment, the present invention provides a method for producing a display comprising a carrier substrate made of glass, the display having flexible, bendable and/or elastic properties at least in a predetermined region of the carrier substrate. The method includes introducing modifications into the carrier substrate within the region of the carrier substrate by laser radiation along at least one closed and/or linear contour and/or points. At least within the region, at least one flexible, bendable and/or elastic layer is applied to the carrier substrate. A side of the carrier substrate facing away from the at least one flexible, bendable and/or elastic layer is subjected to an etching attack, by which material removal from the carrier substrate takes place along the modifications along the at least one closed and/or linear contour and/or at the points of the region until recesses are produced that extend at least over a substantial part of a material thickness of the carrier substrate between the at least one flexible, bendable and/or elastic layer and an outer surface of the carrier substrate facing away from the at least one flexible, bendable and/or elastic layer.

BRIEF DESCRIPTION OF THE DRAWINGS

Subject matter of the present disclosure will be described in even greater detail below based on the exemplary figures.

All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
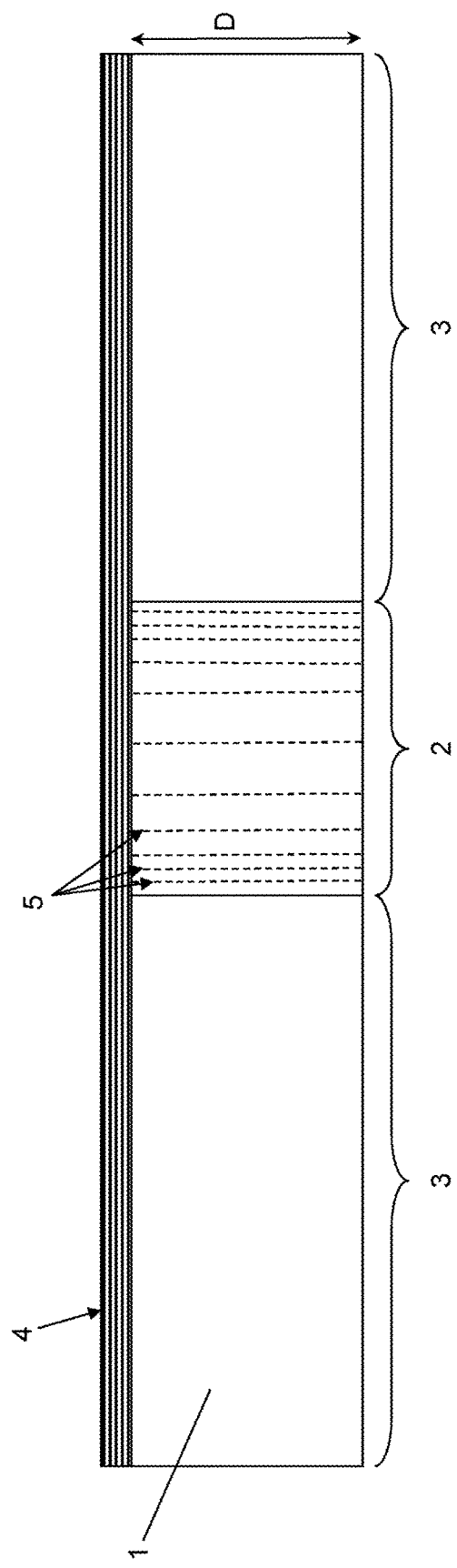
FIG. 1 shows a sectional side-view of a carrier substrate intended for a flexible display with at least one covering layer.

In an embodiment, the present invention provides a carrier substrate for a display, which has flexible properties even in the case of a comparatively large material thickness.

According to an embodiment of the invention, flexible or elastic properties are realized at least in a predetermined region of the carrier substrate, in that firstly within the region of the carrier substrate that is intended to be given the desired flexible properties, modifications are introduced by means of laser radiation into the carrier substrate, in particular over its entire width, along a closed contour and thus enclosing a partial area of the carrier substrate. At least one flexible layer is applied to the carrier substrate at least in the flexible region of the carrier substrate to be created, but preferably also to adjacent regions of the carrier substrate. The carrier substrate is subsequently exposed to an etching attack. Material is removed from the carrier substrate along the closed and/or linear contour of the laser-modified regions, so that either partial areas of the carrier substrate are detached or slit-shaped cuts are created as recesses.

These recesses preferably extend over a large part of the entire thickness of the carrier substrate between the layer on the carrier substrate and an outer surface of the carrier substrate facing away from the layer.

The recesses thus produced form a flexible region, which is realized as a flexure hinge. In one embodiment, the flexure hinge can be designed as a torsion joint and, for this purpose, consists at least of sections of at least one region that can be twisted or rotated.

In contrast to the prior art, an embodiment of the invention assumes that, instead of removing the glass backplanes, they are selectively modified with a laser at selected locations before the display is manufactured. The modified regions are characterized by the fact that they can be removed by wet-chemical methods in a targeted and much faster manner than non-modified regions. Laser modification does not significantly degrade the integrity of the glass carrier substrate, so that it can still be used in the subsequent display manufacturing process.

A thin metal layer, in particular a chromium layer as an adhesion promoter and a copper layer as an etching resist, are then applied to the carrier substrate. Alternatively, a polymer layer can also be applied at this point. What both possible layers have in common is that they have an at least limited durability with respect to wet-chemical etching solutions and are at the same time flexible enough to be folded.

The metal layer or the polymer layer preferably covers the flexible region of the carrier substrate to be produced along with the regions of the carrier substrate adjacent thereto, for example even the entire carrier substrate surface.

After completion of the additive processes of display production itself, in particular the application of preferably several layers along with electrical and optical components, the display is encapsulated.

Instead of carrying out ablative or separating methods for the glass backplane as in the case of the prior art, according to an embodiment of the invention, the entire display is exposed to a wet-chemical etching solution. This causes, on the one hand, the reduction in thickness of the glass backplane to a desired value and, on the other hand, the removal of previously laser-modified regions. Encapsulation of the display ensures that the sensitive regions of the display remain protected from being harmed by the etching solution.

In accordance with the modification geometries used, flexible carrier substrate regions can be created or entire sub-regions of the carrier substrate removed, so that only the flexible, bendable display regions are present at this point. In this way, it is achieved that the display has both flexible and rigid regions.

Wet-chemical processing with hydrofluoric acid or comparable means is known per se from the prior art in the production of solid displays.

The engineering glasses to be used later as backplanes as carrier substrate are laser-modified as the first process step. Depending on the desired application, the glass substrate can thus be modified in different ways and folding of the display supported. One approach is the creation of cuts and holes in the glass substrate according to predetermined geometries.

If, for example, the flexible region of the carrier substrate is enclosed by non-flexible carrier substrate regions, the glass substrate will remain present in the end as stabilizing material. This defines regions that are either rigid or flexible.

Another possibility is to provide the glass substrate along the folding section to be produced with a plurality of parallel contours as cutting lines and to ensure flexibility only via the flexible electronic and optical components located below the glass.

This variant can be further developed in such a way that a region of the glass substrate enclosed by the contour is completely removed.

FIG. 1 shows a carrier substrate 1 made of glass intended for producing a flexible or foldable display, wherein the carrier substrate 1 has a central flexible region 2 and inflexible or rigid edge regions 3 adjacent thereto on both sides. All regions 2, 3 are covered by a layer structure consisting of several layers 4 applied in individual planes, wherein the layer structure for its part likewise has flexible properties.

The rigid edge regions 3 have a material thickness D of more than 100 µm. Connected integrally or monolithically to these edge regions 3 is the central region 2, which is equipped with modifications 5 that, as a result of a subsequent etching method, form recesses 6 that, in the exemplary embodiment shown, enable movability in the manner of a flexure joint. The recesses 6 to be created in this region 2 can be introduced in the form of trenches, cuts and/or holes, or the carrier substrate material is even completely removed in this region.

Figure 2:
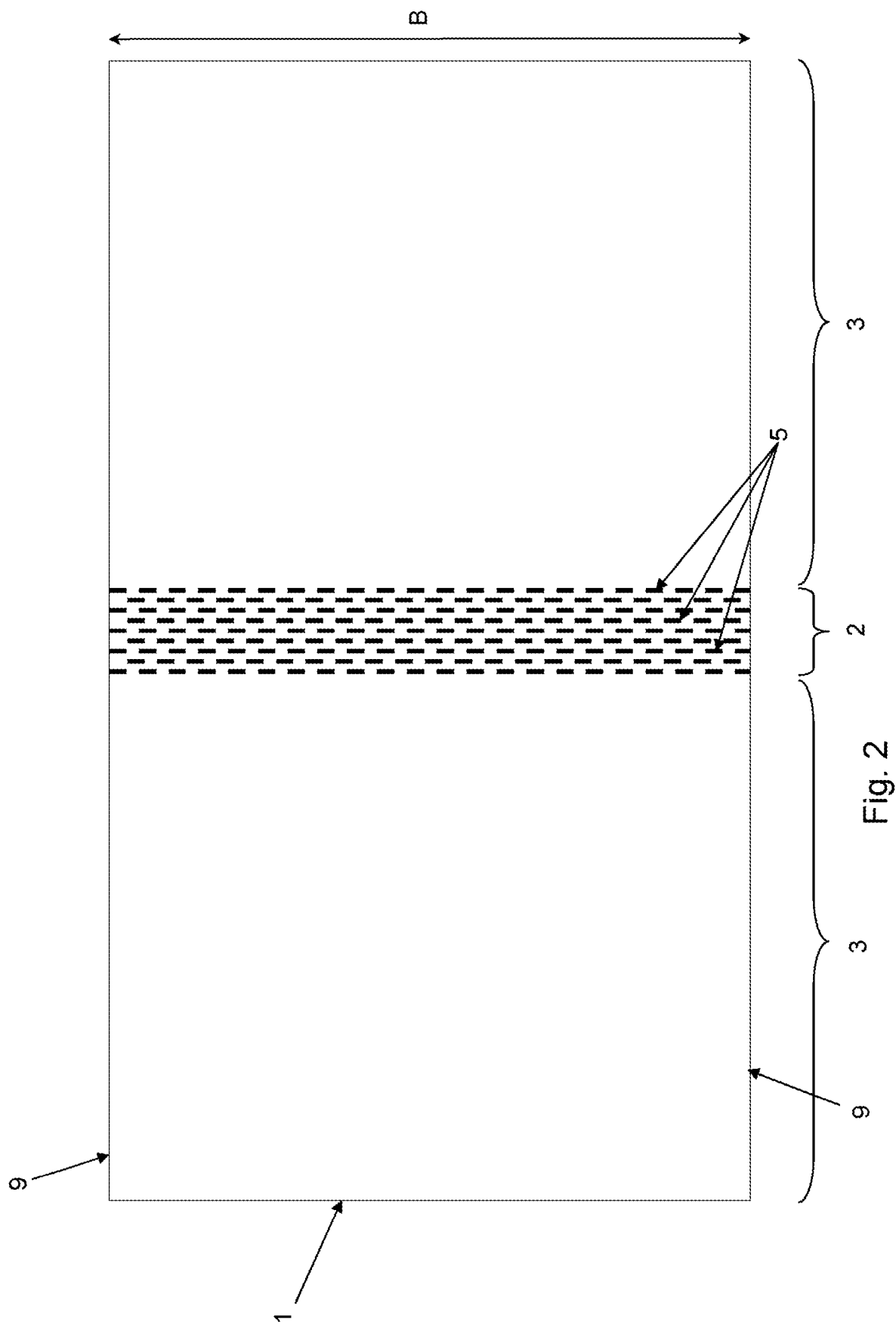
FIG. 2 shows a plan view of a carrier substrate provided with linear modifications.
Figure 3:
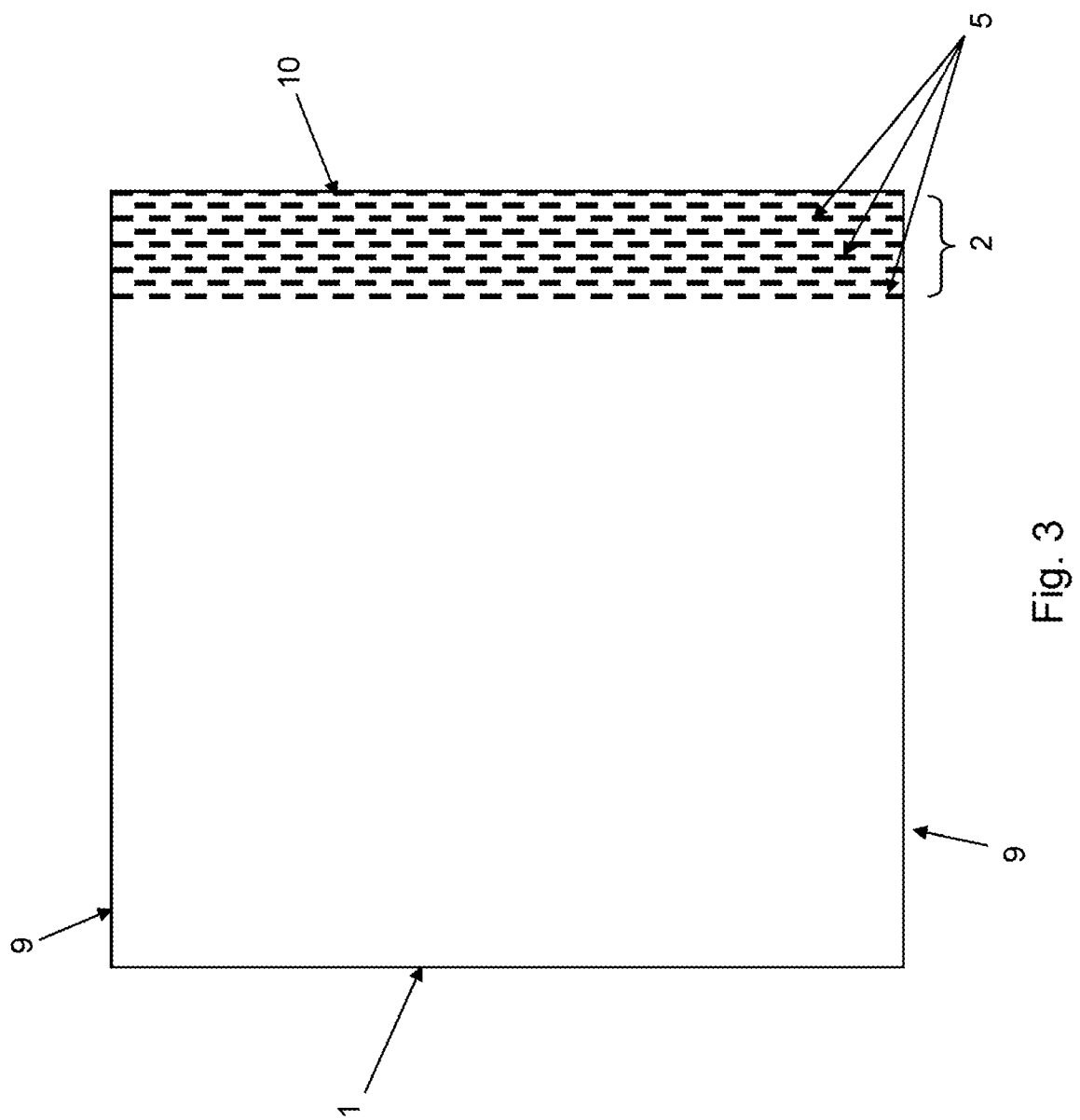
FIG. 3 shows a plan view of a variant of the carrier substrate with modifications on the edge.

FIGS. 2 and 3 in each case show a plan view of the carrier substrate 1. As can be seen, the modifications 5 extend in the flexible region 2 over the entire width B of the carrier substrate 1 between opposite side edges 9 of the carrier substrate 1, so that a homogeneous material weakening and thus movability can be achieved over the entire width B of the display built up on the carrier substrate 1.

While in the variant according to FIG. 2, rigid edge regions 3 adjoin both sides of the flexible region 2, FIG. 3 also shows a variant with which the flexible region 2 lies in the edge region of the carrier substrate 1 that adjoins the rigid edge region 3 and thus forms an edge termination 10 of the carrier substrate 1.

Figure 4:
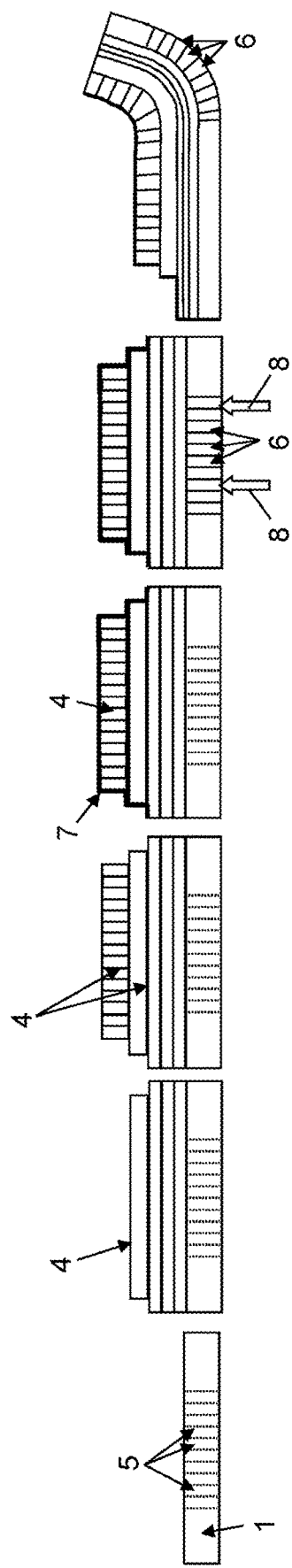
FIG. 4 shows the method steps in the production of the display.

The individual method steps for generating the contour are explained in more detail below with reference to FIG. 4. Starting from the modification of the carrier substrate 1 in the central region, the surface of the carrier substrate 1 is then vapor-deposited in a PVD system with a thin layer 4 of chromium and copper and the copper layer is subsequently reinforced in an electroplating system to a thickness of several micrometers until a continuous but flexible layer 4 forms.

By means of magnetron sputtering (PVD) the layer 4 is deposited, for example as seed layers, on the modified carrier substrate. The carrier substrate 1 is placed upside down in the PVD system and the chamber evacuated. After heating the carrier substrate 1 to a temperature of approximately 200° C., a layer 4 of chromium approximately 100 nm thick and then a layer 4 of copper approximately 350 nm thick are deposited on the carrier substrate surface. After the carrier substrate 1 has cooled to approximately 100° C., the chamber is ventilated and the carrier substrate 1 removed.

Next, the seed layer of the glass substrate is galvanically reinforced. For this purpose, the carrier substrate 1 is fixed in a wafer holder and, with the aid of an electroplating system, approximately 5 μm of copper is deposited on the seed layer. The carrier substrate 1 is then rinsed with deionized water and dried using dry air.

After completion of the additive processes of the actual display production, in particular the application of preferably a plurality of layers 4 along with electrical and optical components, encapsulation is carried out by applying a cover layer 7 of the display.

This is followed by the etching of the carrier substrate 1 in a solution of hydrofluoric acid for a period of about 120 minutes with a 5% HF solution until at least the entire modified regions 2 have been removed by etching. In addition, extending the etching pass by a few micrometers will increase the reliability of the system.

An additional process can be carried out in practice between the modification and the layer application (polymer or metal) and the wet-chemical etching step for producing the actual display.

At the end of the one-sided etching attack 8, a carrier substrate 1 made of glass, which can be folded in some areas and is firmly connected to a continuous, likewise foldable metal layer, is produced. With this variant, it is no longer necessary to remove the glass backplane. Accordingly, the production sequence is reduced by one process step that produces rejects.

Depending on the variant, the partially flexible backplane glass supports the display itself and is less susceptible to damage.

Figure 5:
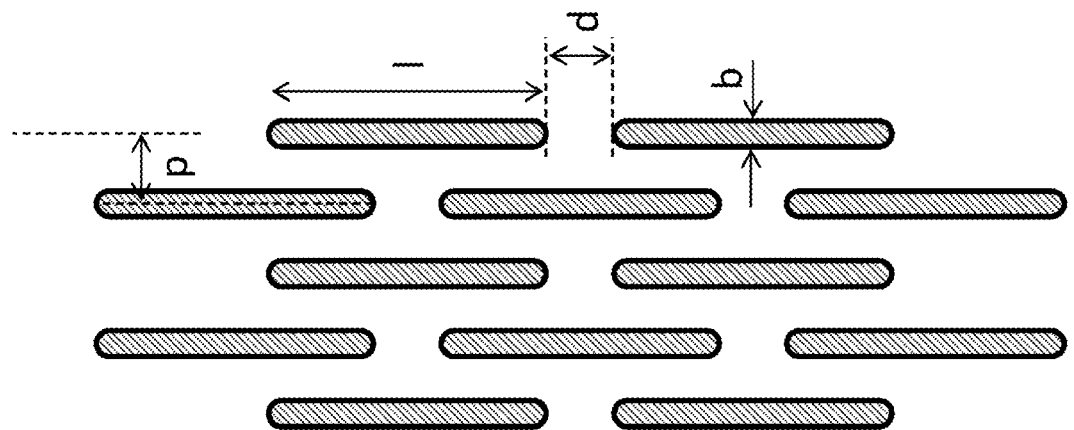
FIG. 5 shows a plan view of a torsion joint formed by cuts.

In summary, the method steps for producing a display using the glass substrate 1 can be described as follows:
1. Providing a rigid glass substrate 1
2. Introducing modifications 5 into the glass substrate 1 by laser radiation
3. Applying the layer structure consisting of multiple layers 4
4. Applying a cover layer 7 for encapsulating the layer structure
5. Etching the glass substrate 1 at least on one side to produce microstructures with recesses 6 in order to form the flexure joint In a plan view, FIG. 5 shows a torsion joint formed by cuts, with which at least individual sections have a width b of less than 100 μm and a length l greater than 300 μm, wherein the cuts are spaced apart from one another in parallel by webs of width p greater than 100 μm. In the longitudinal direction, adjacent cuts have a separation d greater than 100 μm.

Figure 6:
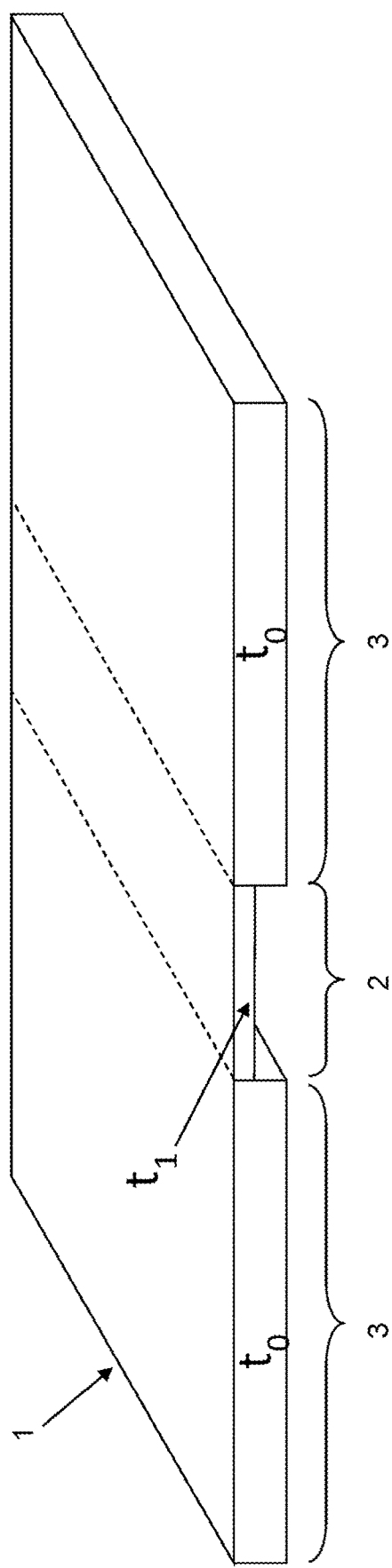
FIG. 6 shows a plan view of a flexible region and regions adjoining thereto.

FIG. 6 shows a plan view of a flexible region 2 and regions 3 adjoining thereto, wherein the flexible region 2 is formed in that the material thickness to is reduced by the etching attack only in the region of the modifications 5 to a thickness ti at which the carrier substrate 1 becomes flexible.

Figure 7:
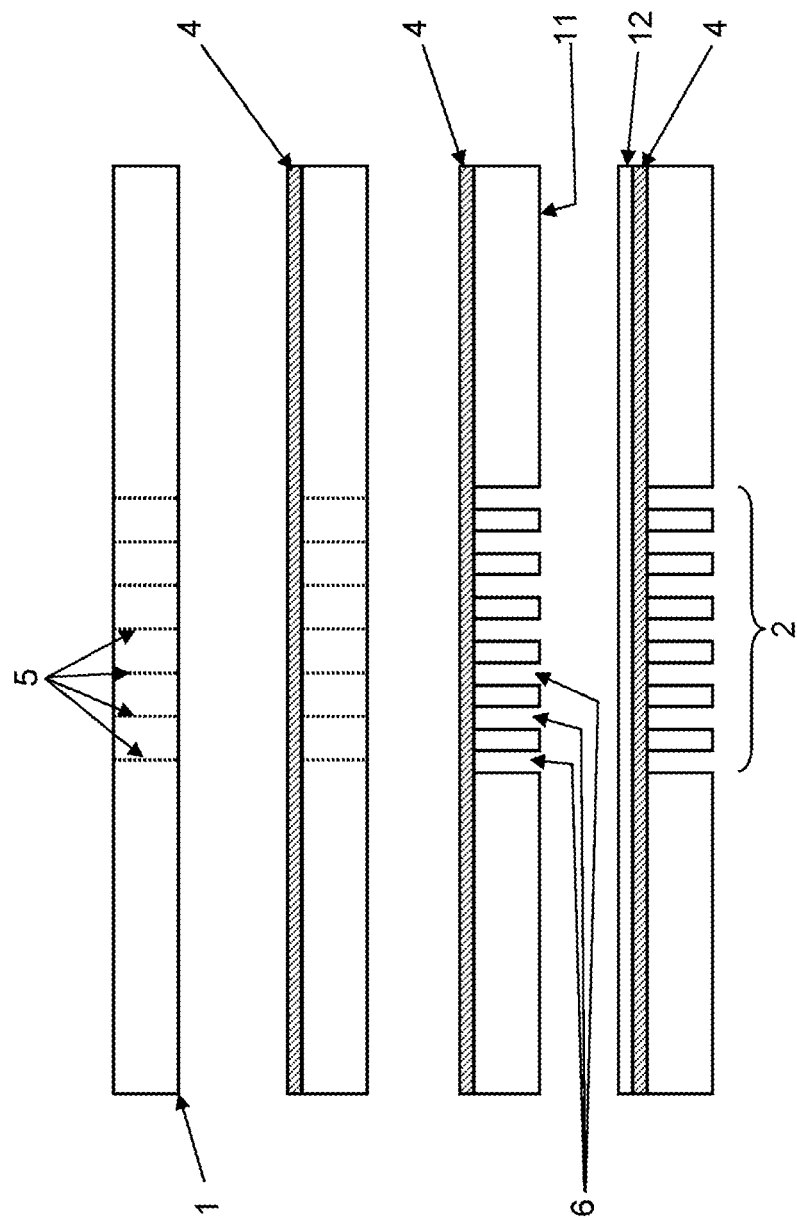
FIG. 7 shows the method steps for producing a carrier substrate of a variant of the method with a polymer intermediate layer.

FIG. 7 shows a variant of the method for producing the carrier substrate 1 made of glass, which is flexible in the central region 2, and has a material thickness of approximately 200 μm. For this purpose, modifications 5 are first introduced into the carrier substrate 1 within the region 2 of the carrier substrate 1 by means of laser radiation without any material having been already removed from the carrier substrate 1. In the next step, the carrier substrate 1 is coated on one side with a preferably transparent layer 4 made of a polymer having a thickness of a few μm, wherein the polymer is applied, for example, in a liquid state and then cured before further processing. The layer 4 retains its flexible or elastic properties. The composite thus created is subsequently exposed to an etching attack, wherein the polymer layer 4 acts as an etching resist. As a result, material is removed in the carrier substrate 1, starting from an outwardly facing outer surface 11 corresponding to the previously introduced modifications 5 of the laser-modified regions 2, material being removed anisotropically until the recesses 6 thus created extend between the layer 4 and the outer surface 11 of the carrier substrate 1 facing away from the layer 4. Finally, a flexible glass substrate 12, for example congruent to the carrier substrate 1, is applied to the polymer layer 4.

Figure 8:
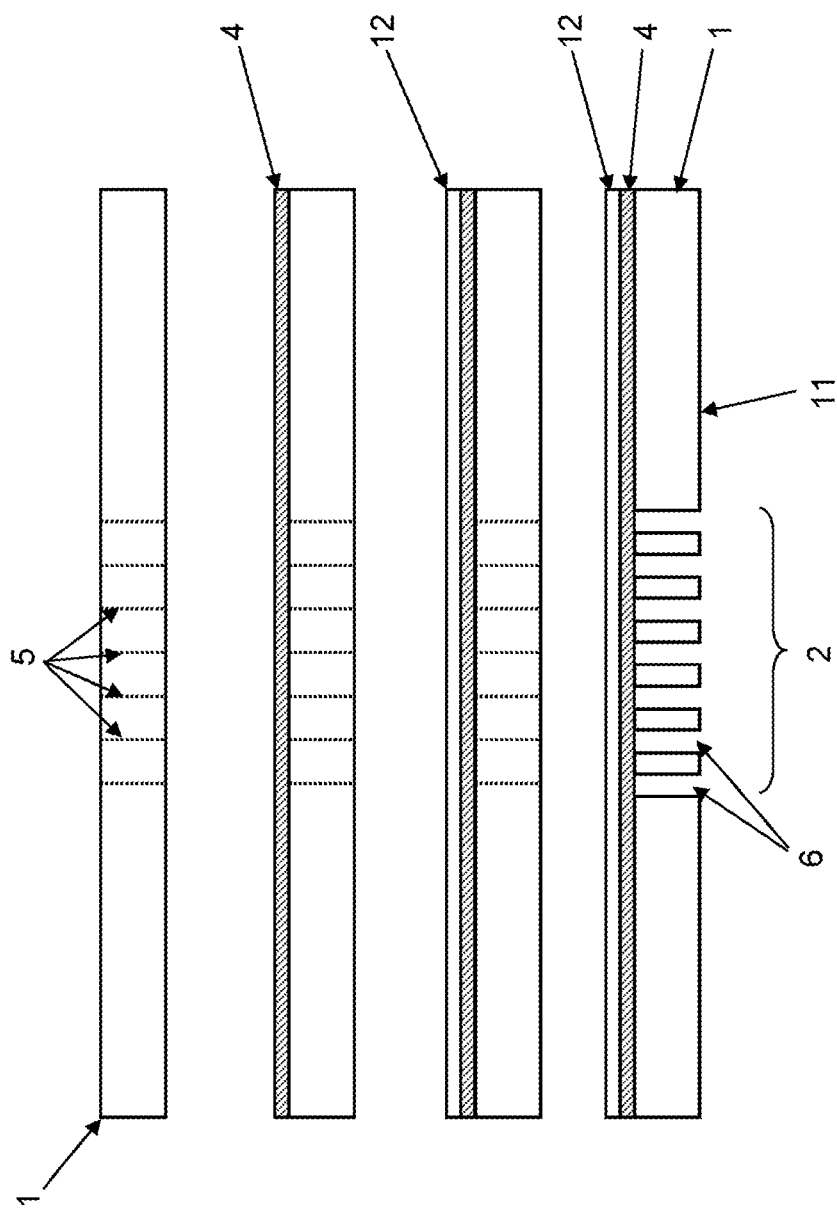
FIG. 8 shows the method steps for producing a carrier substrate of a further variant of the method with a polymer intermediate layer.

FIG. 8 shows a further variant of the method. Before the etching process is carried out, a material composite is produced as laminated glass, wherein the carrier substrate 1 provided with the modifications 5 is connected to the flexible glass substrate 12 by the polymeric adhesive layer 4. The material composite consisting of the carrier substrate 1, the glass substrate 12 and the polymer layer 4 is subsequently exposed to an etching attack, wherein material removal from the carrier substrate 1 proceeds anisotropically along the modifications 5 in the carrier substrate 1 until the recesses 6 thus produced extend between the layer 4 and the outer surface 11 of the carrier substrate 1 facing away from the layer 4. By exposing the composite glass with the external carrier substrate 1 and the external glass substrate 12 to the etching attack, etch-resistant properties of the enclosed polymer layer will be dispensable. In addition, the flexible glass substrate 12 can also have modifications that are exposed to anisotropic material removal in the etching bath, so that the desired structures are produced in the carrier substrate 1 and the glass substrate 12 in a common method step.

Figure 9:
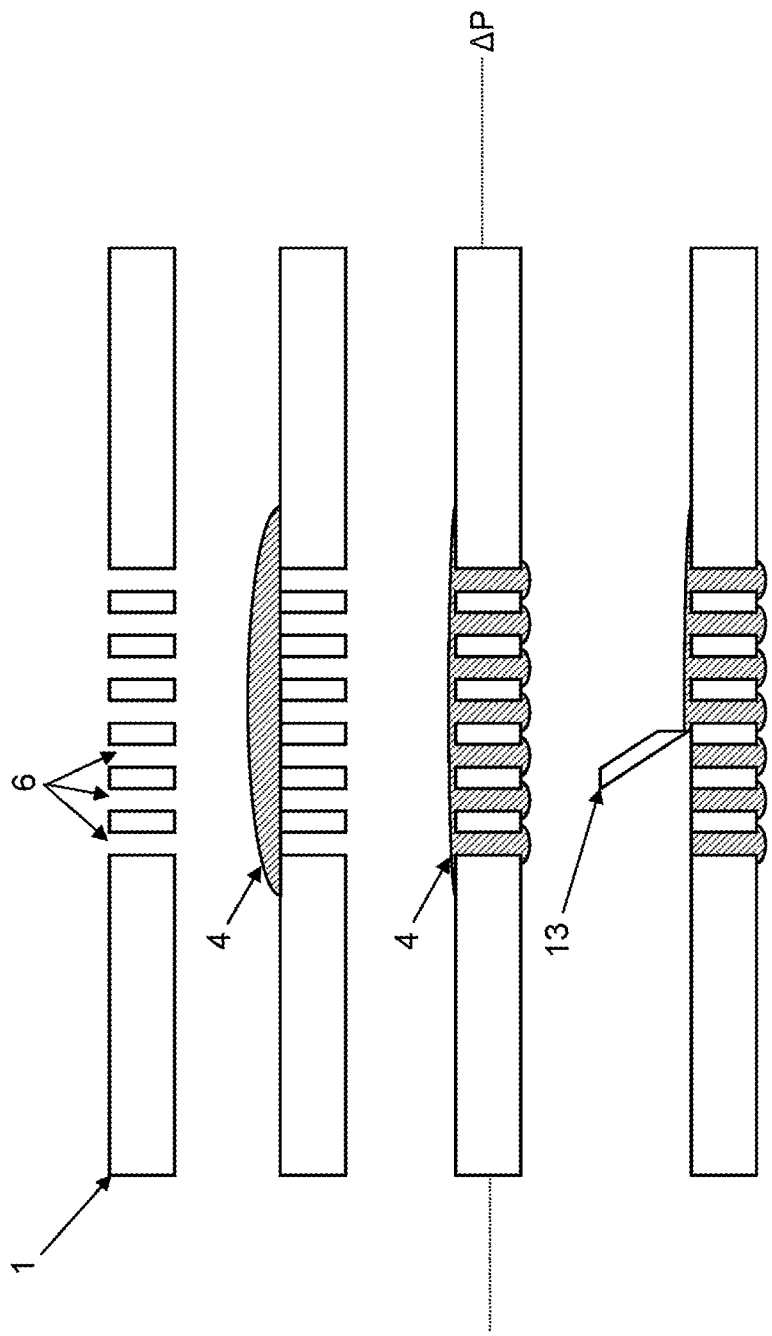
FIG. 9 shows the method steps for applying a polymer layer to a carrier substrate provided with through-openings.

FIG. 9 also shows an optimized method for applying the polymer layer 4 to a carrier substrate 1 provided with through-openings as recesses 6. In this case, the polymer layer 4 is applied in a flowable state as a liquid polymer to the region of the carrier substrate 1 provided with the recesses 6 and is pressed or sucked through the recesses 6 by applying a pressure differential Δp. The layer 4 is then produced and cured by UV-curing the polymeric material. At least one flat outer surface 11 can be produced by removing the excess layer material, for example by means of a removal tool 13.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for producing a display comprising a carrier substrate made of glass, the display having flexible, bendable and/or elastic properties at least in a predetermined region of the carrier substrate, the method comprising:
   introducing modifications into the carrier substrate within the region of the carrier substrate by laser radiation along at least one closed and/or linear contour and/or points;
   applying, at least within the region, at least one flexible, bendable and/or elastic layer to the carrier substrate; and
   subjecting a side of the carrier substrate facing away from the at least one flexible, bendable and/or elastic layer to a wet-chemical etching attack, by which material removal from the carrier substrate takes place along the modifications along the at least one closed and/or linear contour and/or at the points of the region until recesses are produced that extend at least over a substantial part of a material thickness of the carrier substrate between the at least one flexible, bendable and/or elastic layer and an outer surface of the carrier substrate facing away from the at least one flexible, bendable and/or elastic layer.

2. A method for producing a carrier substrate for a display having flexible, bendable and/or elastic properties at least in a predetermined region of the carrier substrate, the method comprising:
   introducing modificiations into the carrier substrate within the region of the carrier substrate by laser radiation along at least one closed and/or linear contour and/or points;
   applying, at least within the region, at least one flexible, bendable and/or elastic layer to the carrier substrate; and
   subjecting a side of the carrier substrate facing away from the layer to a wet-chemical etching attack, by which material removal of the carrier substrate along the modifications along the at least one closed and/or linear contour and/or at the points of the region takes place until recesses are produced that extend at least over a substantial part of a material thickness of the carrier substrate between the at least one flexible, bendable and/or elastic layer and an outer surface of the carrier substrate facing away from the at least one flexible, bendable and/or elastic layer, thereby forming a flexure hinge.

3. The method according to claim 1, wherein a sacrificial layer as a carrier of the at least one flexible, bendable and/or elastic layer is applied to the carrier substrate, and wherein the wet-chemical etching attack is continued until the sacrificial layer is reached, so that the sacrificial layer dissolves or reduces and a disconnection of a surface of the carrier substrate delimited by the at least one closed and/or linear contour from the surrounding glass substrate and from the at least one flexible, bendable and/or elastic layer occurs.

4. The method according to claim 1, wherein a plurality of parallel contours are created in the region of the carrier substrate.

5. The method according to claim 1, wherein an organic light-emitting diode (OLED) is applied as the at least one flexible, bendable and/or elastic layer, and/or wherein the at least one flexible, bendable and/or elastic layer serves as a carrier of a thin-film component.

6. The method according to claim 1, wherein the modifications are introduced into the carrier substrate before the at least one flexible, bendable and/or elastic layer is applied, and/or wherein the wet-chemical etching attack is carried out after the at least one flexible, bendable and/or elastic layer has been applied.

7. The method according to claim 1, wherein the at least one flexible, bendable and/or elastic layer is applied also to adjacent regions of the carrier substrate.

8. The method according to claim 1, wherein the wet-chemical etching attack is limited to a partial region of the carrier substrate by an etching resist.

9. The method according to claim 1, wherein the recesses in the region are filled with a flexible and/or stretchable polymer.

10. A method for producing at least one carrier substrate, having flexible, bendable and/or elastic properties at least in a predetermined region of the carrier substrate, the method comprising:
   introducing modifications into the carrier substrate within the region of the carrier substrate by laser radiation along at least one closed and/or linear contour and/or at points;

applying at least one flexible, bendable and/or elastic layer of a polymer is applied to the carrier substrate, the at least one flexible, bendable and/or elastic layer being transparent;

exposing the carrier substrate to a wet-chemical etching attack, wherein the polymer acts as an etching resist, and by the wet-chemical etching attack material removal from the carrier substrate takes place along the modifications along the at least one closed and/or linear contour and/or at the points of the region until recesses are produced that extend at least over a substantial part of a material thickness of the carrier substrate between the at least one flexible, bendable and/or elastic layer and an outer surface of the carrier substrate facing away from the at least one flexible, bendable and/or elastic layer; and applying, subsequent to the wet-chemical etching attack, at least one flexible glass substrate to the at least one flexible, bendable and/or elastic layer in at least the region of the carrier substrate.

11. A method for producing at least one carrier substrate having flexible, bendable and/or elastic properties at least in a predetermined region of the carrier substrate, the method comprising:

introducing modifications into the carrier substrate within the region of the carrier substrate by laser radiation along at least one closed and/or linear contour and/or at points applying at least one flexible, bendable and/or elastic layer of a polymer to the carrier substrate, the at least one flexible, bendable and/or elastic layer being transparent;

appying, subsequent to applying the at least one flexible, bendable and/or elastic layer, at least one flexible glass substrate to the at least one flexible, bendable and/or elastic layer in at least the region of the carrier substrate; and then exposing the carrier substrate, the glass substrate and the polymer layer to a wet-chemical etching attack, by which material removal from the carrier substrate takes place along the modifications along the at least one closed and/or linear contour and/or at the points of the region until recesses are produced that extend at least over a substantial part of the material thickness of the carrier substrate between the at least one flexible, bendable and/or elastic layer and an outer surface of the carrier substrate facing away from the at least one flexible, bendable and/or elastic layer.

12. The method according to claim 11, wherein the glass substrate has flexible and/or elastic properties and has a material thickness that is less than the carrier substrate and is less than 100 µm.

13. A method for producing a composite glass carrier substrate having flexible, bendable and/or elastic properties at least in a predetermined region of the carrier substrate, the method comprising:

introducing modifications into the carrier substrate along at least one closed and/or linear contour and/or at points within the region of the carrier substrate;

subsequent to introducing the modifications, exposing the carrier substrate to a wet-chemical etching attack, by which material removal from the carrier substrate takes place along the modifications along the at least one closed and/or linear contour and/or at the points of the region until recesses are produced that extend as through-openings between opposite outer surfaces of the carrier substrate; and then applying, at least within the region, at least one flexible, bendable and/or elastic layer to the carrier substrate.

14. The method according to claim 1, wherein the at least one flexible, bendable and/or elastic layeris formed by an ultraviolet (UV)-curable liquid polymer.

15. The method according to claim 14, wherein the at least one flexible, bendable and/or elastic layer in a flowable state is guided through the recesses, which are created as through-openings in the carrier substrate, by a pressure difference, and is subsequently cured by UV radiation.

* * * * *